United States Patent
Uekert

(10) Patent No.: US 8,740,202 B2
(45) Date of Patent: Jun. 3, 2014

(54) SIDE GRIPPING MECHANISM AND DEVICE HANDLERS HAVING SAME

(75) Inventor: Kenneth B. Uekert, Ramona, CA (US)

(73) Assignee: Delta Design, Inc., Poway, CA (US)

( * ) Notice: Subject to any disclaimer, the term of this patent is extended or adjusted under 35 U.S.C. 154(b) by 501 days.

(21) Appl. No.: 13/049,578

(22) Filed: Mar. 16, 2011

(65) Prior Publication Data

US 2011/0226372 A1    Sep. 22, 2011

Related U.S. Application Data

(60) Provisional application No. 61/314,993, filed on Mar. 17, 2010, provisional application No. 61/315,365, filed on Mar. 18, 2010.

(51) Int. Cl.
*B25B 11/00* (2006.01)
*B23Q 3/08* (2006.01)

(52) U.S. Cl.
USPC ............................................. 269/24; 269/21

(58) Field of Classification Search
USPC ........... 269/43, 3, 6, 246, 291, 37, 20, 21, 25, 269/22, 24
See application file for complete search history.

(56) References Cited

U.S. PATENT DOCUMENTS

| 3,758,097 | A | * | 9/1973 | Newswanger | .................. 269/27 |
| 5,842,272 | A | | 12/1998 | Nuxoll | |
| 6,711,797 | B1 | * | 3/2004 | Bennett et al. | ............... 29/281.6 |
| 2004/0183320 | A1 | | 9/2004 | Evans et al. | |

OTHER PUBLICATIONS

PCT International Search Report and Written Opinion on application No. PCT/US2011/028497 dated May 26, 2011; 7 pages.

* cited by examiner

*Primary Examiner* — Lee D Wilson
*Assistant Examiner* — Nirvana Deonauth
(74) *Attorney, Agent, or Firm* — Foley & Lardner LLP

(57) ABSTRACT

An apparatus comprises a cavity coupled to a pneumatic controller configured to control pressure in the cavity; a piston configured to be pulled into the cavity when pressure in the cavity is below atmospheric pressure and to be pushed outward when pressure in the cavity is greater than atmospheric pressure; and a gripper arm mechanically coupled to the piston. The gripper arm may be configured to support a device under test. The gripper arm may be coupled to the piston through a pusher bar. The apparatus may further comprise a pneumatic control port; and a pneumatic bleed port. The pneumatic control port is coupled to the cavity, and the pneumatic bleed port is configured to bleed pneumatic pressure to atmosphere if the piston over-travels a predetermined position.

4 Claims, 12 Drawing Sheets

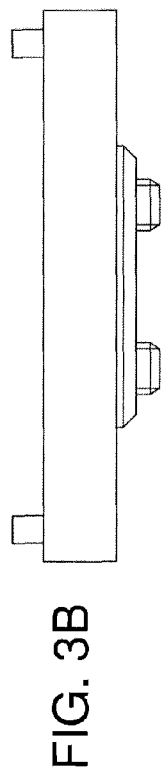
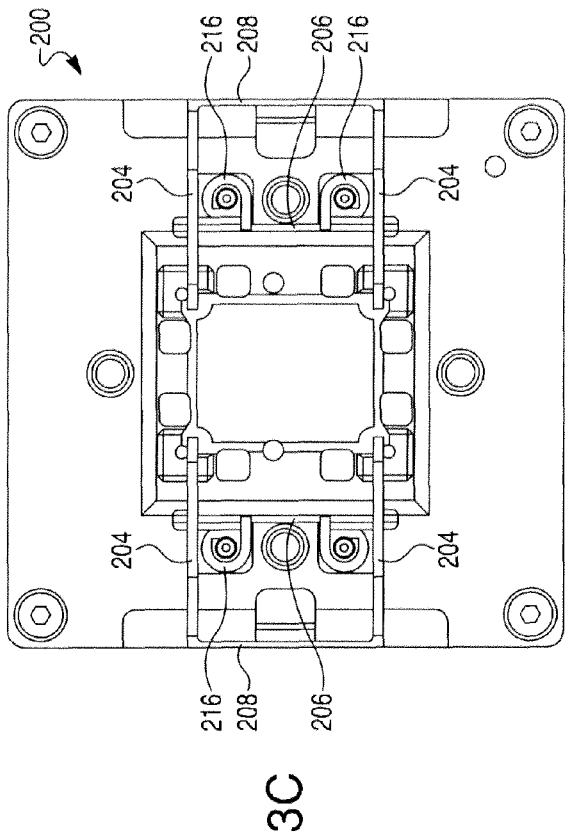
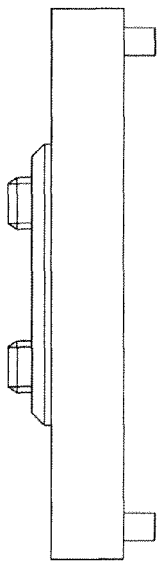
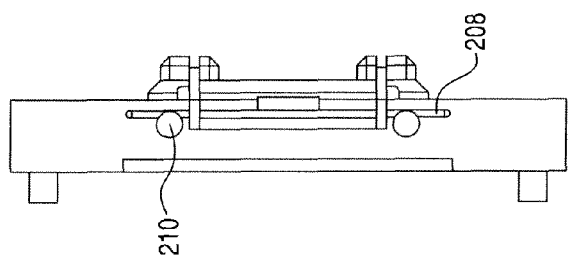
FIG. 3B
FIG. 3C
FIG. 3D
FIG. 3A

SIDE GRIPPING MECHANISM AND DEVICE HANDLERS HAVING SAME

CROSS-REFERENCE TO RELATED APPLICATIONS

This application claims the benefit of U.S. Provisional Application No. 61/314,993, filed on Mar. 17, 2010 and U.S. Provisional Application No. 61/315,365, filed Mar. 18, 2010, which are incorporated herein by reference in their entirety.

FIELD OF THE INVENTION

The present invention relates generally to the field of device handlers and, more particularly, to device handlers with an improved mechanism for gripping the device, such as an integrated circuit (IC) device.

BACKGROUND OF THE INVENTION

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

In testing electronic components, such as integrated circuit (IC) devices, a testing apparatus is often used to assess a component's performance. In this regard, a device handler may hold the device above a testing apparatus, such as an electrical tester and in contact with a thermal conditioning apparatus for device temperature control.

Existing devices use mechanisms such as suction cups to hold the device from above. FIG. 1 illustrates one such device 100 with suction cups 110. The suction cups must be positioned to avoid "keep out" zones on the IC device. This can result in the IC devices setting aside valuable space to accommodate the suction cups, space that may be otherwise used for additional circuitry.

SUMMARY OF THE INVENTION

In one aspect, an apparatus comprises a cavity coupled to a pneumatic controller configured to control pressure in the cavity; a piston configured to be pulled into the cavity when pressure in the cavity is below atmospheric pressure and to be pushed outward when pressure in the cavity is greater than atmospheric pressure; and a gripper arm mechanically coupled to the piston.

In one embodiment, the gripper arm is configured to support a device under test.

In one embodiment, the gripper arm is coupled to the piston through a pusher bar.

In one embodiment, the apparatus further comprises a pneumatic control port; and a pneumatic bleed port. In one embodiment, the pneumatic control port is coupled to the cavity. In one embodiment, the pneumatic bleed port is configured to bleed pneumatic pressure to atmosphere if the piston over-travels a predetermined position.

BRIEF DESCRIPTION OF THE DRAWINGS

Embodiments of the invention are described by referring to the attached drawings, in which:

FIG. 3A illustrates a left side view of the apparatus of FIG. 2;
FIG. 3B illustrates a rear view of the apparatus of FIG. 2;
FIG. 3C illustrates a top view of the apparatus of FIG. 2;
FIG. 3D illustrates a front view of the apparatus of FIG. 2.

DETAILED DESCRIPTION OF THE PREFERRED EMBODIMENTS

In the following description, for purposes of explanation and not limitation, details and descriptions are set forth in order to provide a thorough understanding of the present invention. However, it will be apparent to those skilled in the art that the present invention may be practiced in other embodiments that depart from these details and descriptions.

In accordance with embodiments of the present invention, a gripping apparatus is provided which substantially reduces the need for space on the IC device.

Figure 2:
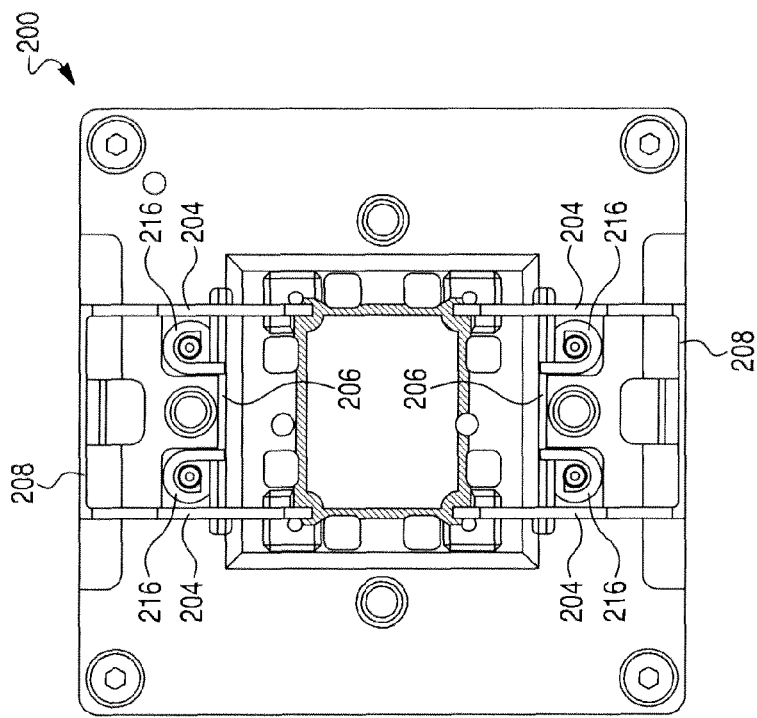
FIG. 2 is a top view of an apparatus in accordance with embodiments of the present invention.
Figure 1:
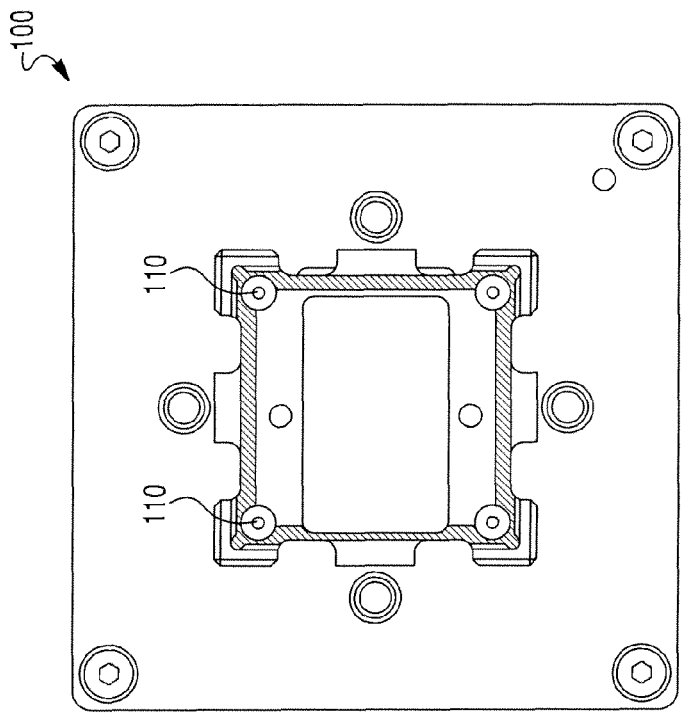
FIG. 1 is top view of a conventional apparatus.
Figure 3F:
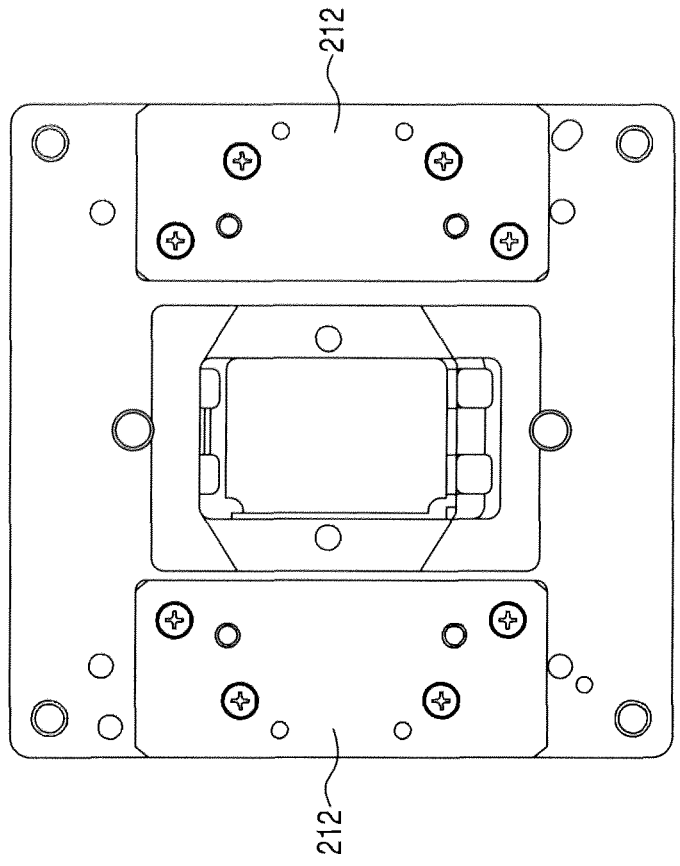
FIG. 3F illustrates a bottom view of the apparatus of FIG. 2.
Figure 3E:
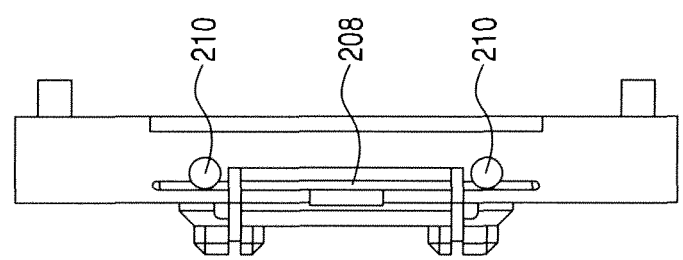
FIG. 3E illustrates a right side view of the apparatus of FIG. 2.

FIG. 2 is a top view of an apparatus 200 in accordance with embodiments of the present invention, and FIGS. 3A-3F illustrate various views of the apparatus 200. In the illustrated embodiment, the apparatus 200 does not include any suction cups. Instead, as described in greater detail below, the apparatus 200 includes gripper arms 204 that grip an IC device 304 substantially on the sides and reduce contact with either the top or bottom surfaces. The apparatus 200 may be integrated with a testing apparatus, such as a thermal head 302, as described in greater detail below with reference to FIGS. 7A-7D.

Figure 4:
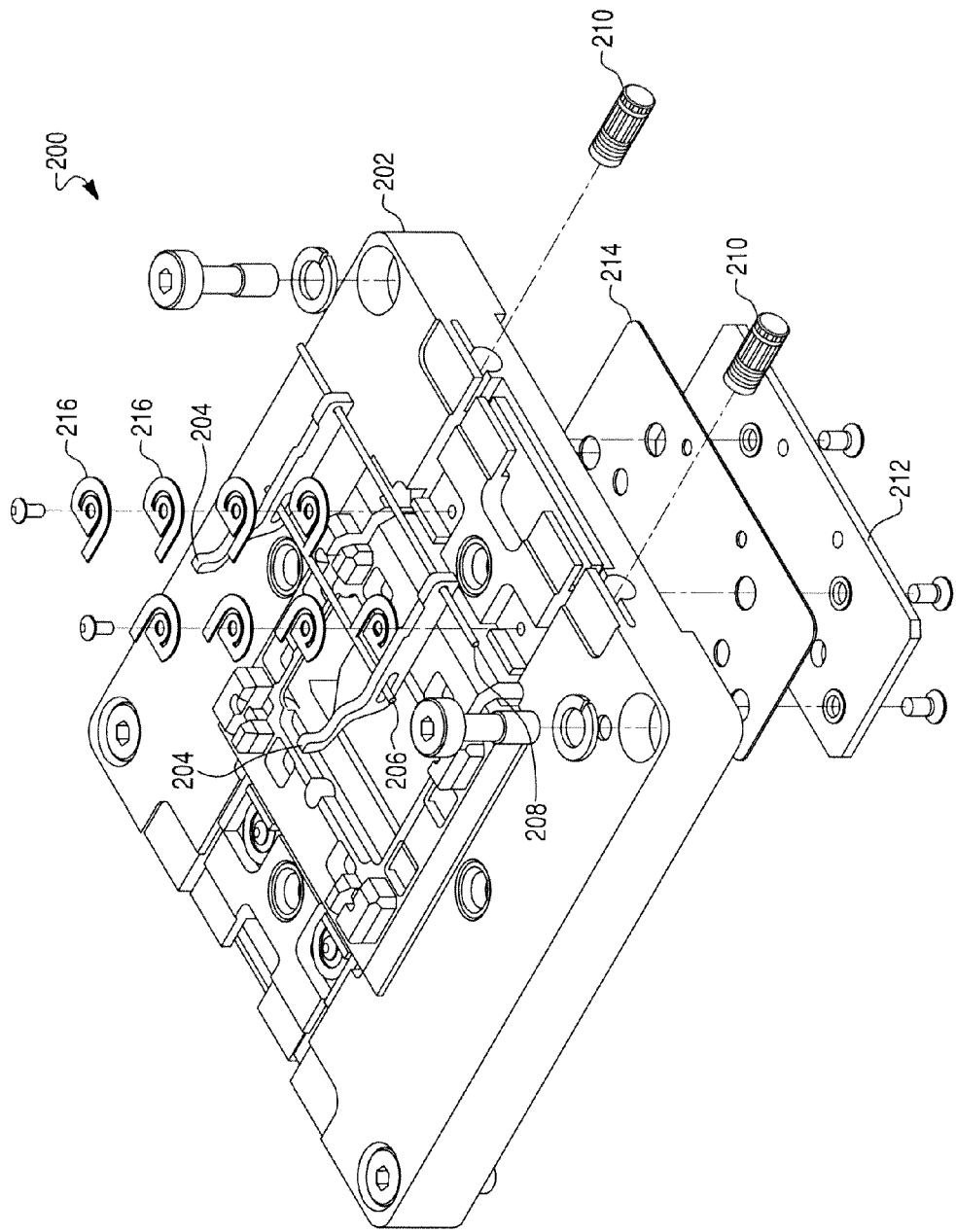
FIG. 4 is an exploded view of the apparatus of FIG. 2.

Referring now to FIG. 4, an exploded view of the apparatus of FIG. 2 is illustrated. The apparatus 200 includes a main housing 202 configured to accommodate the various components associated with a gripper mechanism. Further, the housing 202 may be configured to be integrated with a testing device. The housing 202 may be formed of a variety of materials, including plastic or metal.

The apparatus 200 includes a plurality of gripper arms 204 configured to engage a device, such as an IC device 304, and hold it in a testing position. In the illustrated embodiment, the apparatus 200 is provided with four gripper arms 204. Two gripper arms 204 are provided on each of two opposing sides. For purposes of clarity, only two gripper arms 204 on one of the two opposing sides are shown in FIG. 4. In other embodiments, a different number of gripper arms 204 may be provided.

A pre-load bar 206 and a pusher bar 208 are provided to actuate and limit movement of the gripper arms 204. In the illustrated embodiment, one pre-load bar 206 and one pusher bar 208 are provided to correspond with two gripper arms 204 on one side.

The pusher bars 208 are mechanically coupled to pusher pistons 210. In the illustrated embodiment, a single pusher piston 210 is provided for each gripper arm 204, with two pusher pistons 210 being coupled to each pusher bar 208. Again, for purposes of clarity, only the pusher pistons 210 on one side of the apparatus 200 are illustrated in FIG. 4. In other embodiments, the number of pistons may be more or less than that provided with the illustrated embodiment. For example, in one embodiment, a single piston may be provided to actuate the pusher bar 208, which in turn actuates two gripper arms 204.

As will be described later with reference to FIGS. 5A-5D, the apparatus 200 includes pneumatic control routing for control and actuation of the gripper arms 204. The pneumatic control routing is formed on the underside of the apparatus 200. In order to seal the pneumatic control routing, a pneumatic seal 214 and a backing plate 212 are secured to the underside.

Further, in order to provide proper contact of an IC device 304 to a testing apparatus, the apparatus 200 allows independent floatation of each gripper arm 204. In this regard, a series of gimbal springs, such as spiral springs 216, are provided for each gripper arm 204.

Figure 5A:
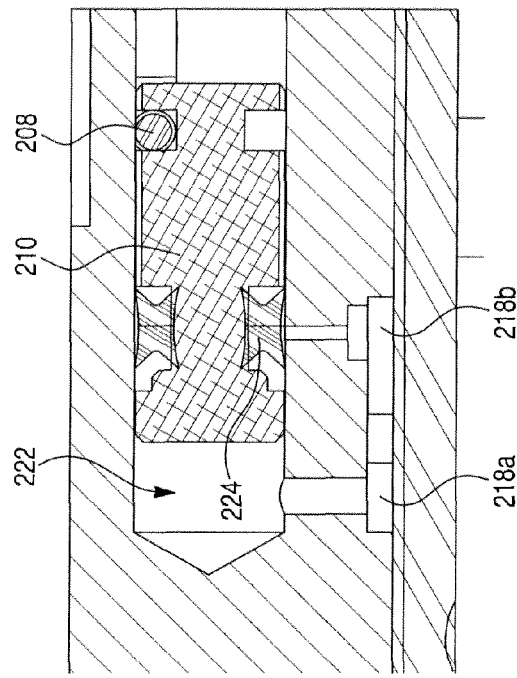
FIG. 5A illustrates a top view showing the pneumatic control routing of the apparatus of FIG. 2.
Figure 5B:
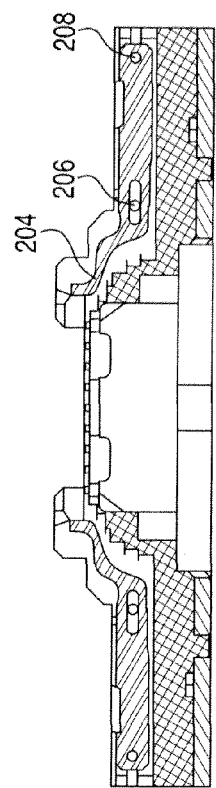
FIG. 5B illustrates a cross-sectional view showing the pneumatic control routing of the apparatus of FIG. 2 along the section A-A.

Referring now to FIGS. 5A-5D, various views of the apparatus 200 illustrate the pneumatic control routing of the apparatus 200. In FIG. 5A, a bottom view of the apparatus 200 with the pneumatic seal 214 and the backing plate 212 removed on one side is illustrated. As illustrated in this view, the apparatus 200 includes pneumatic control holes 218 corresponding to each pusher piston 210. Pneumatic routing 220 leads from each pusher piston 210 location to a controller (not shown).

Figure 5D:
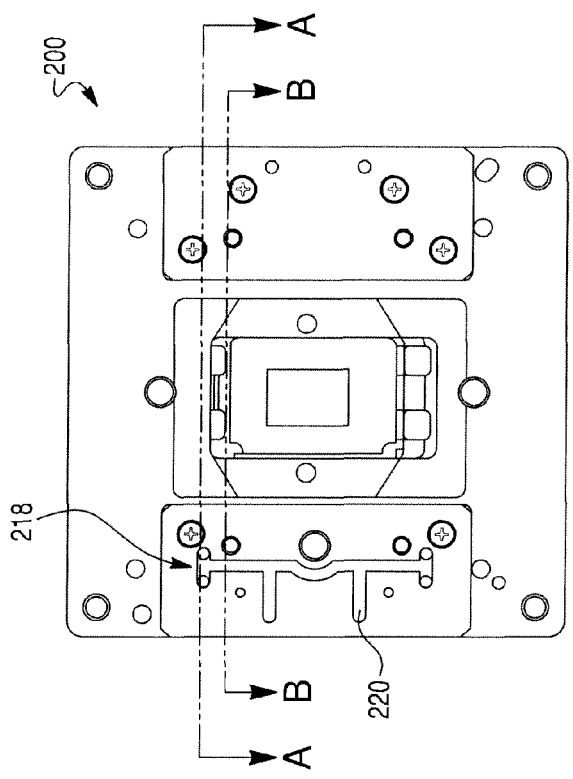
FIG. 5D illustrates an enlarged view of a portion of FIG. 5B showing the pneumatic control routing of the apparatus of FIG. 2.
Figure 5C:
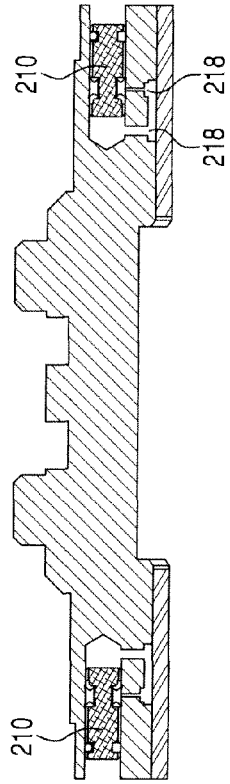
FIG. 5C illustrates a cross-sectional view showing the pneumatic control routing of the apparatus of FIG. 2 along the section B-B.

An enlarged view of the portion of the device containing a pusher piston 210 is illustrated in FIG. 5D. Thus pusher piston 210 is positioned to slide in a cavity formed in the housing 202. The pusher piston 210 engages the pusher bar 208 within the cavity. Thus, as the pusher piston 210 slides within the cavity, the pusher bar 208 is moved forward or backward. The movement of the pusher bar 208, in turn, causes the gripper arms 204 to move forward and backward.

The cavity within which the pusher piston 210 slides includes a vacuum cavity 222 coupled to a pneumatic control port 218a. Thus, when a pneumatic controller generates a vacuum in the vacuum cavity 222 through pneumatic control port 218a, the pressure differential between the vacuum cavity 222 and the external atmosphere causes the pusher piston 210 to move inward (to the left in FIG. 5D). Conversely, when the controller generates a pressure greater than atmospheric pressure in the vacuum cavity 222, the pusher piston 210 is moved outward (to the right in FIG. 5D). As noted above, the movement of the pusher piston 210 causes corresponding movement of the pusher bar 208, which in turn causes corresponding movement of the gripper arms 204.

Figure 6A:
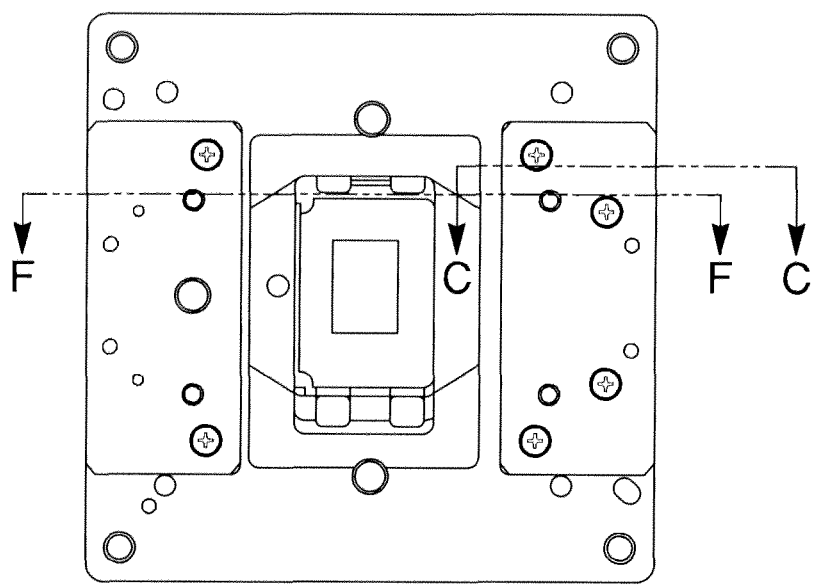
FIG. 6A illustrates a rear view of the apparatus of FIG. 2.
Figure 6B:
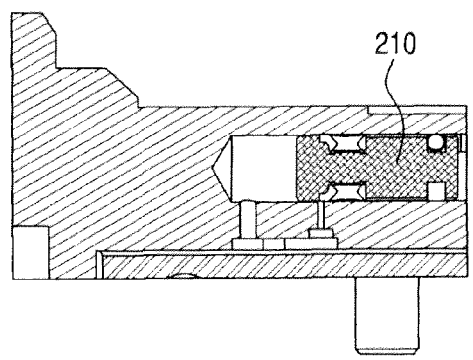
FIG. 6B illustrates a cross-sectional view of the apparatus of FIG. 2 along the section C-C with the gripper in an open position.
Figure 6C:
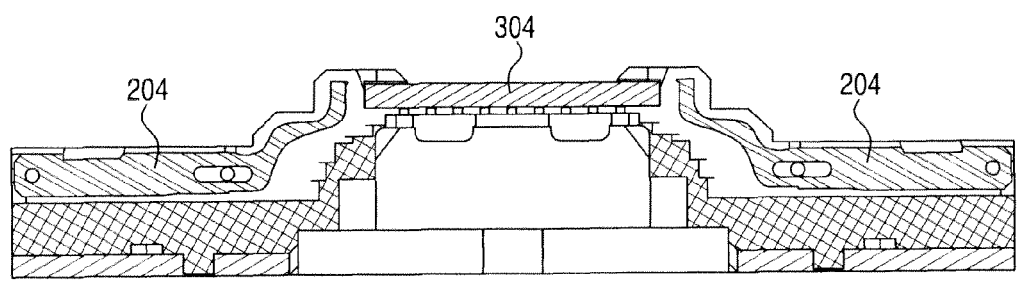
FIG. 6C illustrates a cross-sectional view of the apparatus of FIG. 2 along the section F-F with the gripper in an open position.
Figure 6D:
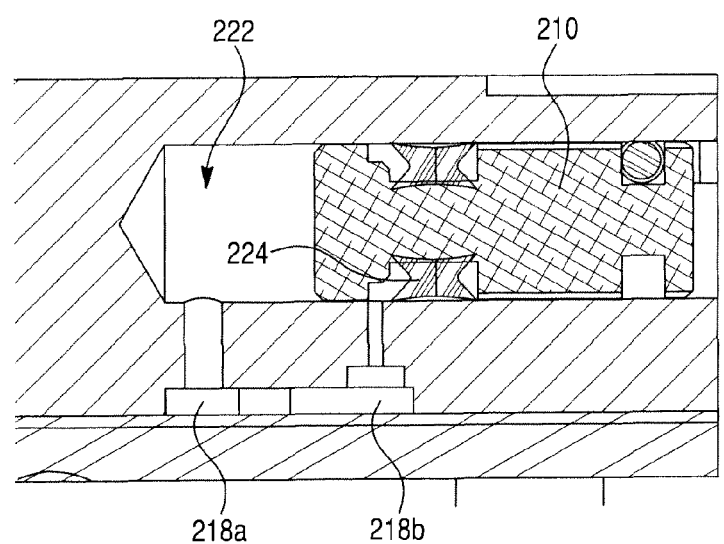
FIG. 6D illustrates an enlarged cross-sectional view of the apparatus of FIG. 2 along the section C-C with the gripper in an open position.
Figure 6E:
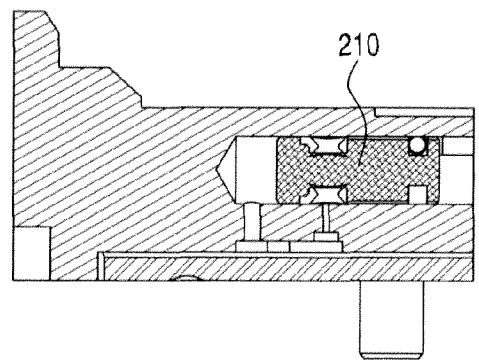
FIG. 6E illustrates a cross-sectional view of the apparatus of FIG. 2 along the section C-C with the gripper holding a device.
Figure 6F:
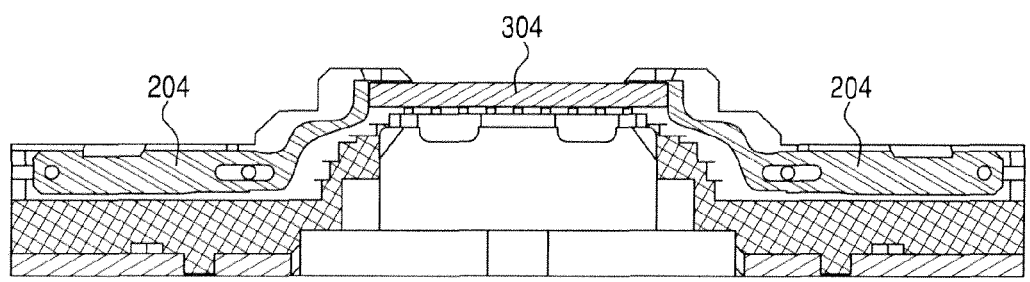
FIG. 6F illustrates a cross-sectional view of the apparatus of FIG. 2 along the section F-F with the gripper holding a device.
Figure 6G:
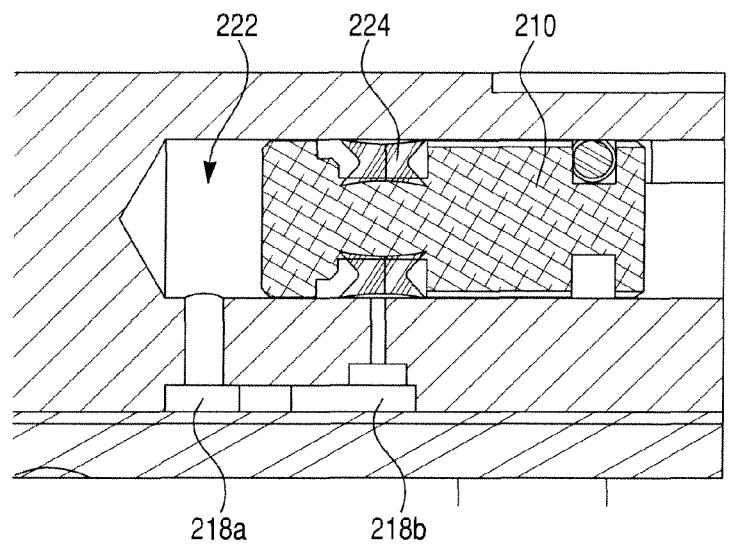
FIG. 6G illustrates an enlarged cross-sectional view of the apparatus of FIG. 2 along the section C-C with the gripper holding a device.
Figure 6H:
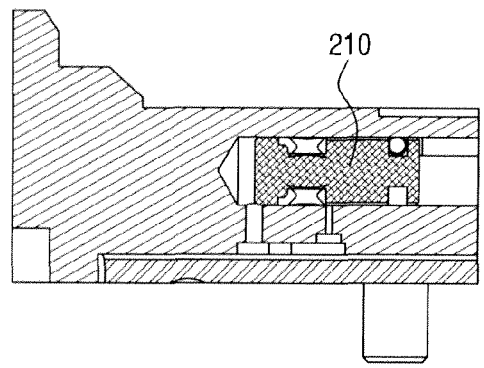
FIG. 6H illustrates a cross-sectional view of the apparatus of FIG. 2 along the section C-C with the gripper in a closed position without holding a device.
Figure 6I:
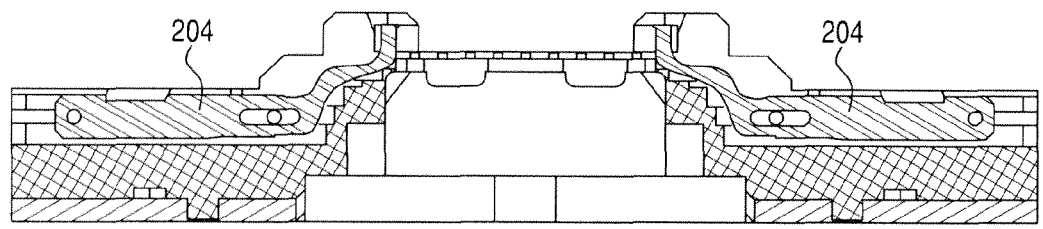
FIG. 6I illustrates a cross-sectional view of the apparatus of FIG. 2 along the section F-F with the gripper in a closed position without holding a device.
Figure 6J:
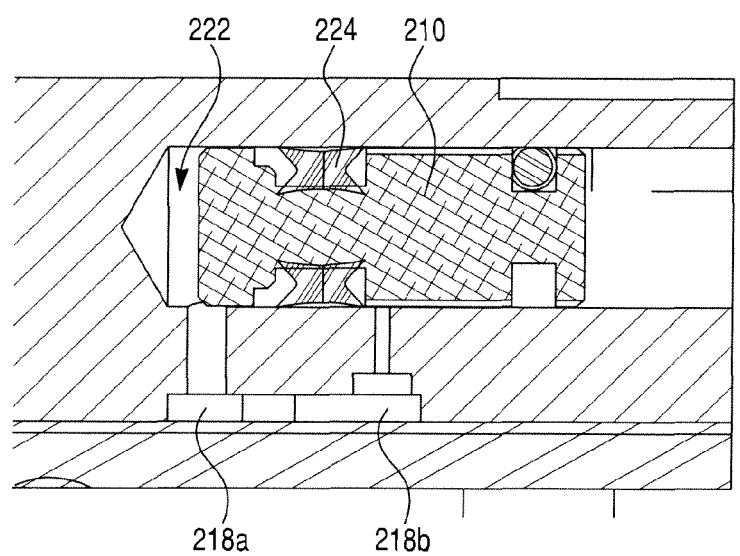
FIG. 6J illustrates an enlarged cross-sectional view of the apparatus of FIG. 2 along the section C-C with the gripper in a closed position without holding a device.
Figure 7A:
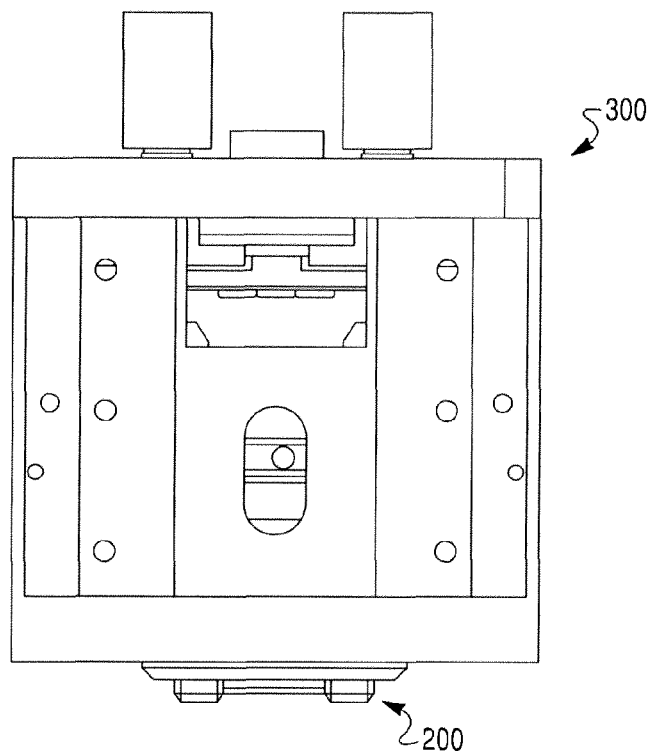
FIG. 7A illustrates a side view of the apparatus of FIG. 2 integrated with a thermal conditioning apparatus.
Figure 7B:
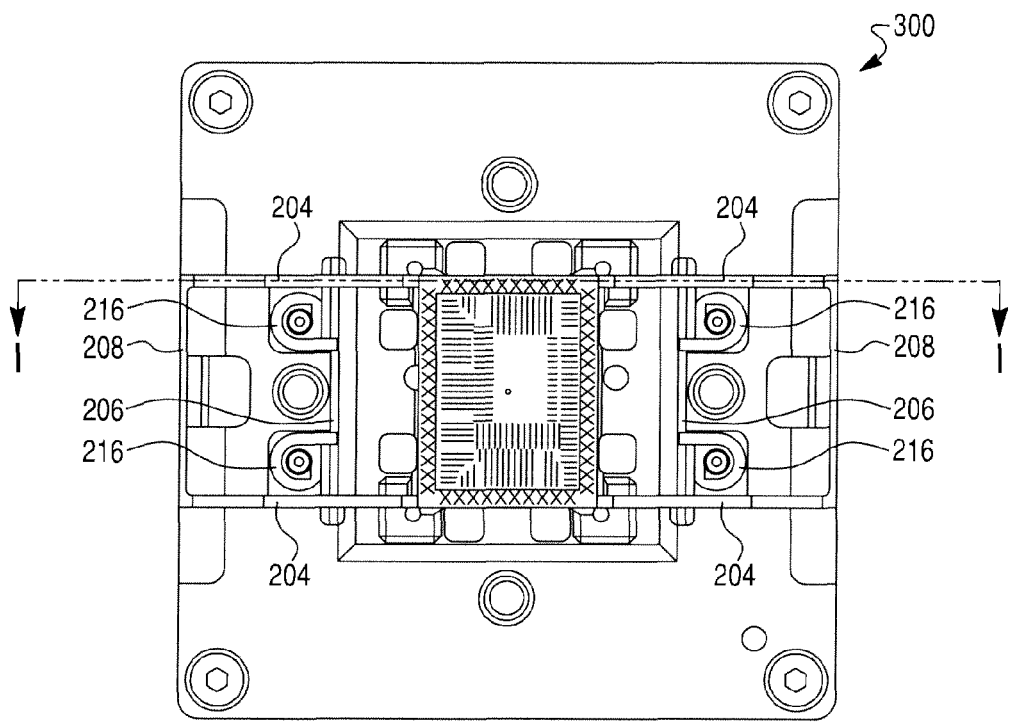
FIG. 7B illustrates a top view of the apparatus of FIG. 2 integrated with a thermal conditioning apparatus.
Figure 7C:
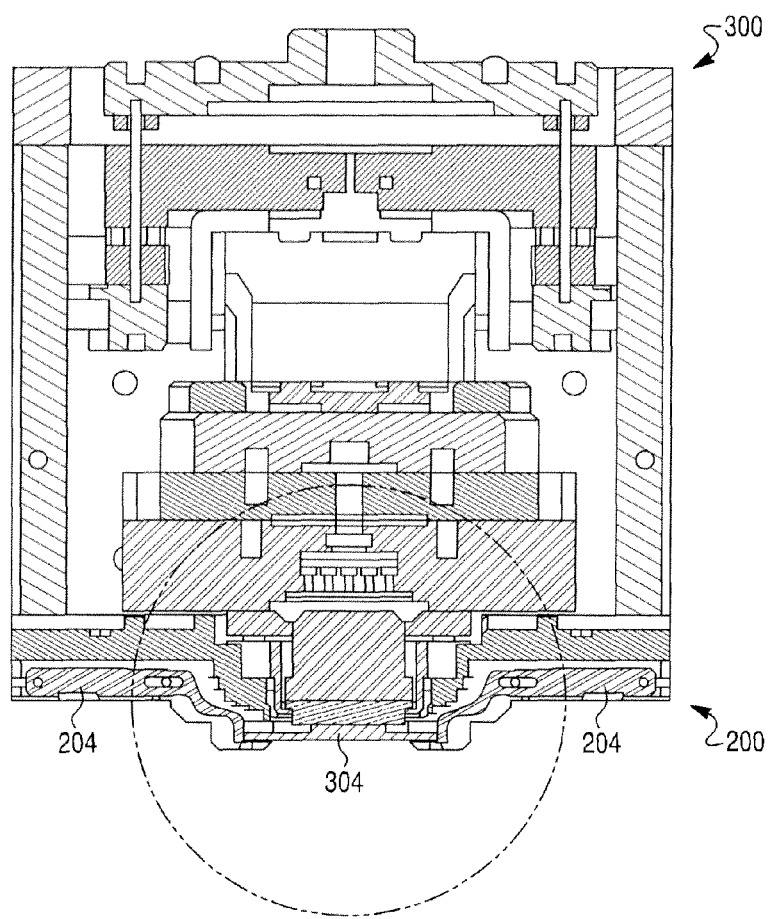
FIG. 7C illustrates a cross-sectional view of the apparatus of FIG. 2 integrated with a thermal conditioning apparatus along the section I-I.
Figure 7D:
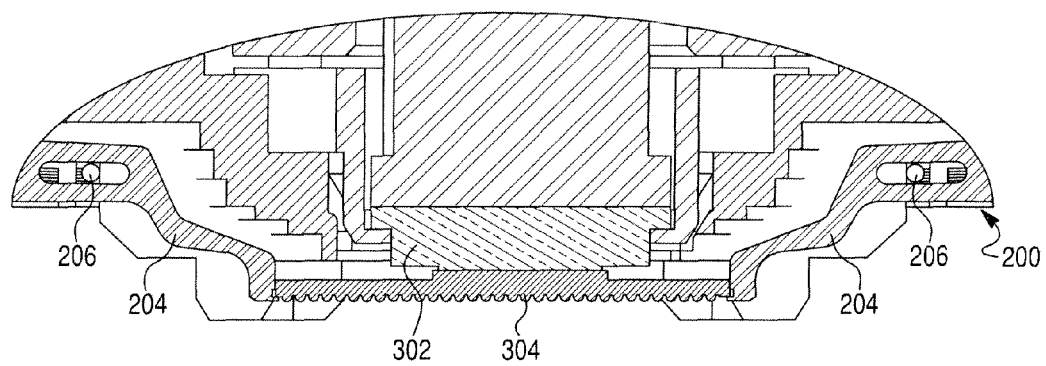
FIG. 7D illustrates an enlarged cross-sectional view of the apparatus of FIG. 2 integrated with a thermal conditioning apparatus along the section I-I.

In addition to providing pneumatic control of the gripper arms 204, the apparatus 204 also allows for detection of the position of the gripper arms 204 through measurement of pneumatic pressure. FIGS. 6A-6J illustrate cross-sectional views of the apparatus of FIG. 2 with the gripper in an open position (FIGS. 6B-6D), holding a device 304 (FIGS. 6E-6G), and in a closed position without holding a device (FIGS. 6H-6J).

Referring to the open position (FIGS. 6B-6D), the pusher piston 210 is positioned such that a pneumatic bleed port 218b is positioned to the inside of a U-ring seal 224 positioned around the pusher piston 210. In this position, the U-ring seal 224 prevents leakage of pneumatic pressure (or vacuum) to the atmosphere.

Referring now to the "holding device" position (FIGS. 6E-6G), the pusher piston 210 is position such that the pneumatic bleed port 218b is positioned at the U-ring seal 224. Again, in this position, the U-ring seal 224 prevents leakage of pneumatic pressure (or vacuum) to the atmosphere.

If the pneumatic controller generates a vacuum in the vacuum cavity 222 but no IC device 304 is to held by the gripper arms 204, the pusher piston 210 over-travels the closed position, as shown in FIGS. 6H-6J. In this position, the pneumatic bleed port is positioned on the outside of the U-ring seal 224. Pneumatic pressure may then leak through the pneumatic bleed port 218b to the atmosphere (t) the right of the pusher piston 210). The pneumatic control system may detect the loss in pneumatic pressure and conclude the over-travel of the pusher piston 210.

Referring now to FIG. 7, the apparatus 200 is illustrated as integrated with a thermal conditioning apparatus 300. As shown in the detailed illustration in FIG. 7D, the gripper arms 204 hold a device under test (DUT) 304 in contact with a thermal conditioning apparatus, such as a thermal head 302.

Figure 8:
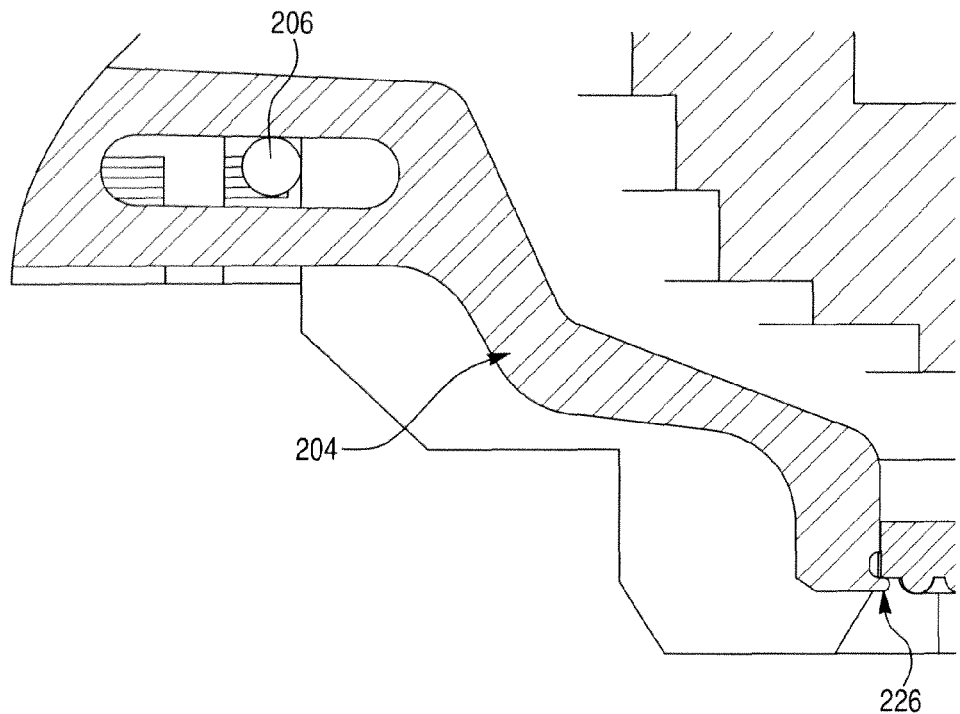
FIGS. 8 and 9 illustrate different embodiments of the gripper arm for the apparatus of FIG. 2.
Figure 9:
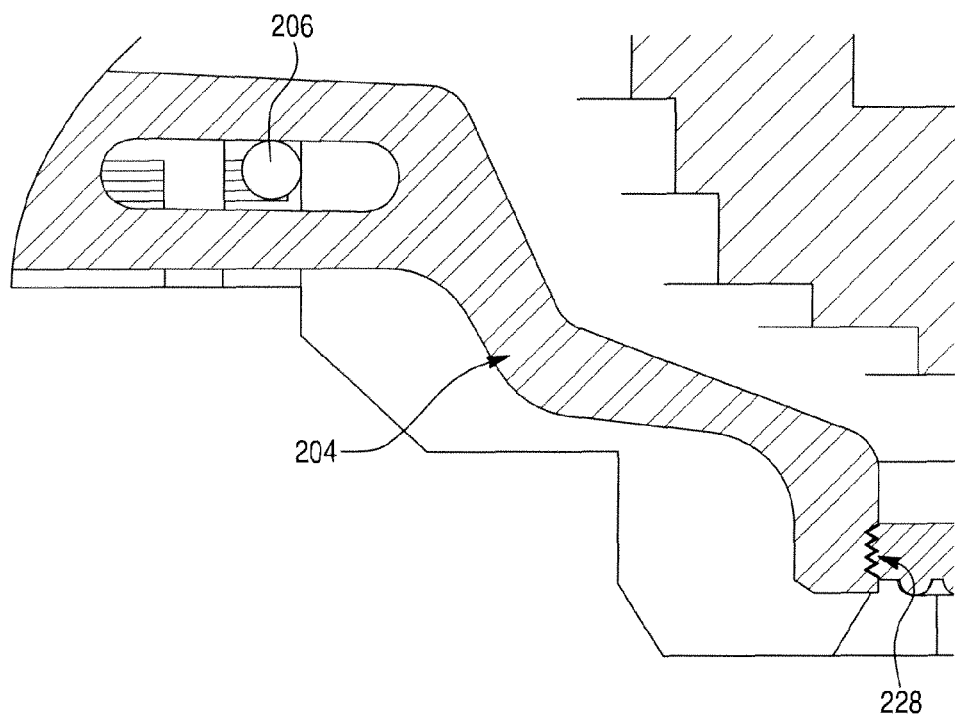

FIGS. 8 and 9 illustrate different embodiments of the gripper arm 204 for the apparatus 200. Referring first to FIG. 8, the gripper arm 204 is provided with a small ledge 226. Thus, the gripper arm 204 engages the DUT 304 substantially on the side of the DUT 304, hut may provide some support from the bottom. This configuration is beneficial since it provides support for the DUT 304 even if pneumatic vacuum fails, either partially or completely.

Referring again to FIG. 5A, it is noted that pneumatic vacuum or pressure in the vacuum cavity 222 is used to cause the pusher piston 210 to move. In the event of pneumatic failure, the cavity 222 goes to atmospheric pressure. Thus, both sides of the pusher piston 210 are balanced at atmospheric pressure. There is no force causing the pusher piston 210 to move outward and, therefore, no force causing the gripper arm 204 to disengage the DUT 304.

Referring now to FIG. 9, the gripper arm 204 is provided with a serrated edge 228. In this configuration, the gripper arm 204 engages the DUT 304 completely on the side of the DUT 304. The pneumatic pressure is sufficient to allow the gripper arms to support the DUT 304. This configuration has the benefit of completely freeing the top and bottom surfaces of the DUT 304, thereby allowing full use of the DUT 304 for circuitry and electronics, for example.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, systems, and computer program products.

What is claimed is:

1. An apparatus, comprising:
a piston;
a gripper arm mechanically coupled to the piston, the gripper arm being configured to grip a device under test;
a cavity in which the piston is configured to slide, wherein the piston is configured to slide in an inward direction and an outward direction within the cavity, the inward direction being a direction in which the piston is configured to slide when causing the gripper arm to grip a device, and wherein the cavity includes a vacuum cavity portion located on an inward side of the piston;
a pneumatic control port coupled to the vacuum cavity portion on the inward side of the piston; and
a pneumatic controller configured to control pressure in the vacuum cavity portion via the pneumatic control port,
wherein the pneumatic controller is configured to generate a vacuum in the vacuum cavity portion so as to cause the piston to slide in the inward direction within the cavity, and
wherein the pneumatic controller is configured to generate a pressure greater than atmospheric pressure in the vacuum cavity portion so as to cause the piston to slide in the outward direction within the cavity.

2. The apparatus of claim 1, wherein the gripper arm is coupled to the piston through a pusher bar.

3. The apparatus of claim 1, further comprising a pneumatic bleed port coupled to the cavity at a location outward of the pneumatic control port.

4. The apparatus of claim 3, wherein the pneumatic bleed port is configured to bleed pneumatic pressure to atmosphere if the piston over-travels a predetermined position.

* * * * *